United States Patent [19]

Rienzo

[11] Patent Number: 4,687,243
[45] Date of Patent: Aug. 18, 1987

[54] APPARATUS FOR HOLDING WORKPIECE

[75] Inventor: Francis B. Rienzo, Wakefield, Mass.

[73] Assignee: GTE Government Systems Corporation, Waltham, Mass.

[21] Appl. No.: 911,709

[22] Filed: Sep. 26, 1986

[51] Int. Cl.⁴ ............................ A61F 1/06; B66C 3/16
[52] U.S. Cl. .................................... 294/86.4; 294/111; 901/21
[58] Field of Search ...................... 294/86.4, 111, 99.1, 294/64.1, 66.1, 100, 106, 112, 113, 119.2, 120; 414/736, 729; 901/21, 19, 31; 623/57, 63, 65

[56] References Cited

U.S. PATENT DOCUMENTS

| 4,258,441 | 3/1981 | Bell | 623/63 |
| 4,259,876 | 4/1981 | Belyanin et al. | 901/21 |
| 4,643,473 | 2/1987 | Douglas | 294/86.4 |

Primary Examiner—James B. Marbert
Attorney, Agent, or Firm—J. Stephen Yeo

[57] ABSTRACT

Two pairs of mechanical fingers are independently remotely controlled by a single handle. The handle is coupled to activating mechanisms via cables. The apparatus is particularly suited for grasping small workpieces such as components on a circuit board.

1 Claim, 5 Drawing Figures

APPARATUS FOR HOLDING WORKPIECE

BACKGROUND OF THE INVENTION

This invention pertains to apparatus, with fingerlike appendages, for grasping objects and more particularly concerned with such apparatus actuated by remote mechanical control.

In many applications, such as placement and removal of components from printed circuit boards, it is desirable to hold a workpiece during an operation, such as soldering or desoldering. One object of the present invention is to provide means for grasping workpieces with remotely controlled fingers. Another object is to provide such apparatus where two pairs of fingers may be controlled independently with one hand control.

DESCRIPTION OF THE INVENTION

Figure 1:
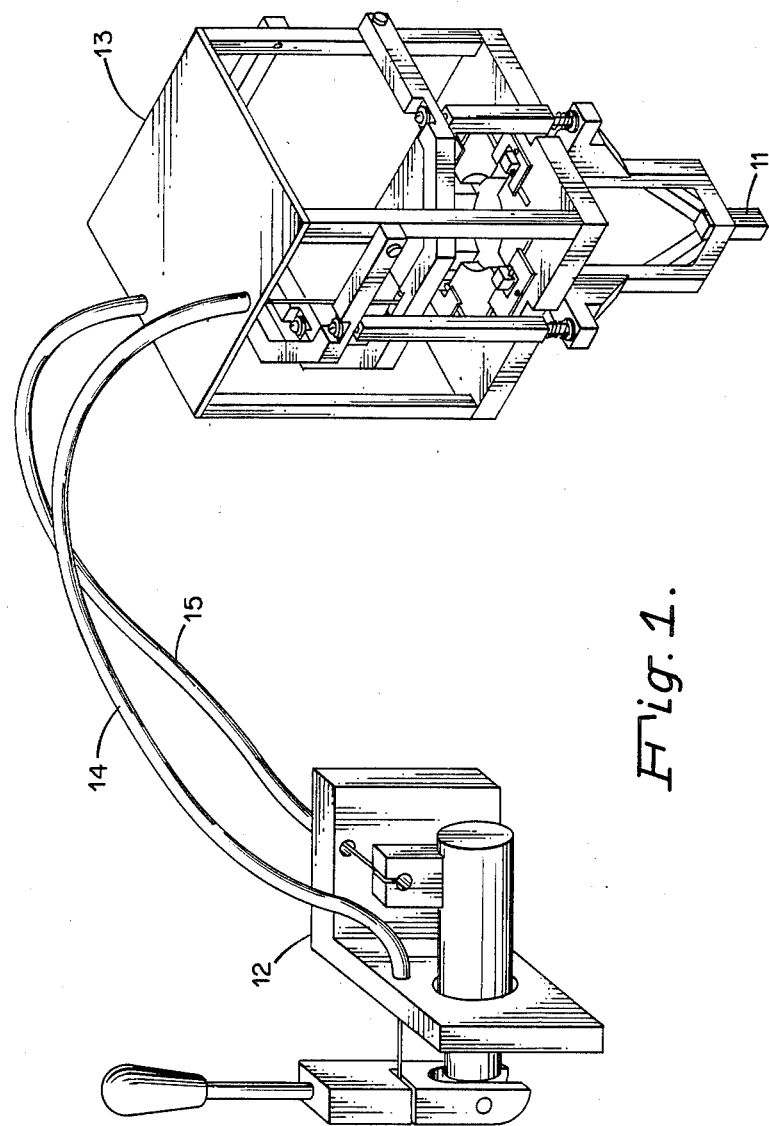
FIG. 1 is an overall view of the apparatus.

The invention is best described in close reference to the drawings, of which FIG. 1 shows the overall apparatus 10 which is intended to hold workpieces 11 during operations, such as electronic components during rework of circuit boards. The apparatus includes a hand operated control unit 12 which is mechanically coupled to a finger assembly 13 through two cables 14, 15. The cables 14, 15 are the type in which a central wire is guided by a hollow jacket. The jacket is held steady while the wire may be moved lengthwise. Both cables 14, 15 may be provided with threaded fittings to simplify connection.

A shaft 19 extends through a hole 20 in wall 17.

Figure 2:
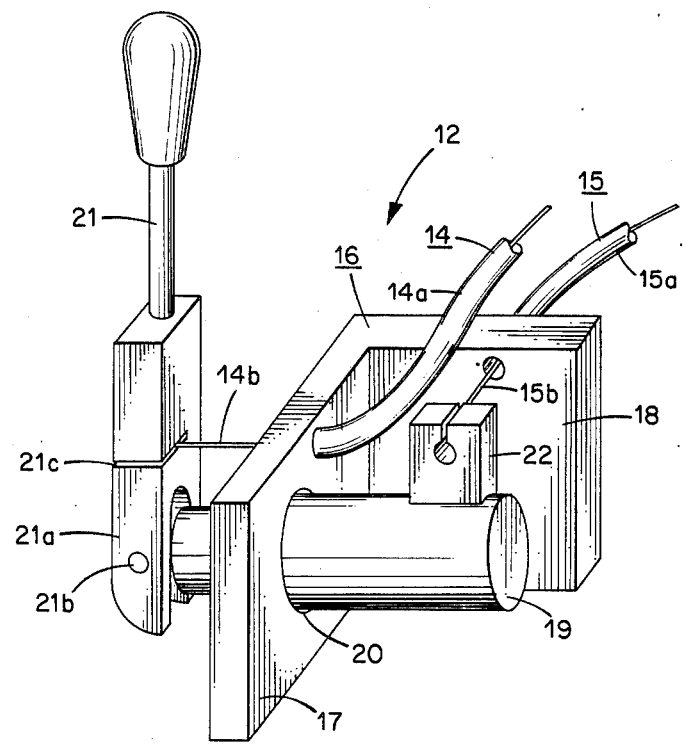
FIG. 2 illustrates the hand control unit.

Hand control unit 12 is shown separately in FIG. 2. Unit 12 has a housing with two orthogonal walls 17, 18. One end of the jacket 14a of the cable 14 is attached to wall 17 which one end of the jacket 15a of cable 15 is attached to wall 18.

A Shaft 19 is arranged to be rotated within the hold but not to move lengthwise. A handle 21 is arranged to pivot at one end of the shaft 19. The handle may include a fork 21a which is connected to the shaft 19 by a pin 21b.

Handle 21 is provided with a slot 21c or other clasping means to retain the center wire 14b of cable parallel to the axis of the shaft 19. The other end of shaft 19, which is in proximity to the end of cable 15, has a slotted tab 22 or other clasping means to retain the center wire 15b of cable 15, tangent to shaft 19.

Handle 21, when pivoted by hand, causes central wire 14b of the cable 14 to move. The handle 21 when turned by hand rotates shaft 19 which causes the central wire 15b of cable 15 to move. Cables 14, 15 transfer the handle movement to the finger assembly 13 which is seen in detail in the remaining drawings. As will be described each cable actuates a corresponding pair of fingers.

Figure 3:
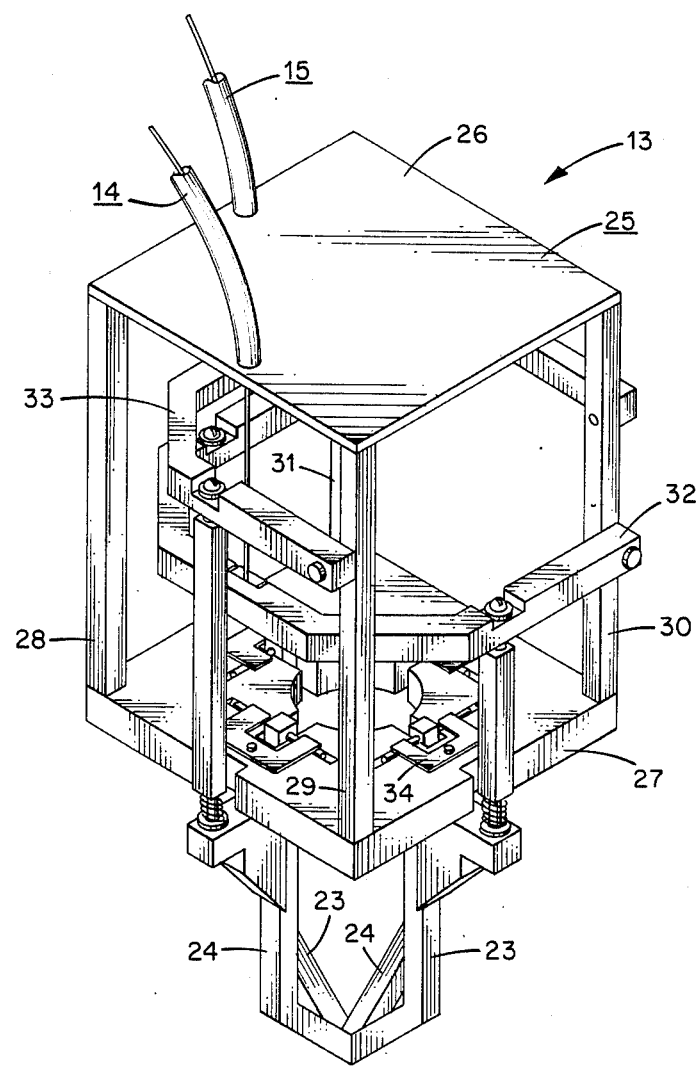
FIG. 3 pictures the finger assembly.

Turning to FIG. 3, finger assembly 13 has two pairs 23, 24 of elongated fingers pivotly suspended from a cage 25. Cage 25 has an upper plate 26 and a lower plate 27, both of which may be square. The plates 26, 27 are held apart by vertical bars 28, 29, 30, 31 secured to the corners of the plates 26, 27. Two forks 32, 33 are mounted on the cage at right angles to each other. Each fork has two arms joined at one end by a connecting segment. The free end of the arms are pivotly connected to two of the cage bars. The connecting segment may be beveled to avoid the cage bars.

Each fork 32, 33 is connected to a central wire of a corresponding cable 14, 15, and is then held generally horizontal, supported at one end by the cable wire and at the other end by the pivots. Two pairs of fingers 23, 24 are pivotly suspended from the lower plate 27.

Figure 4:
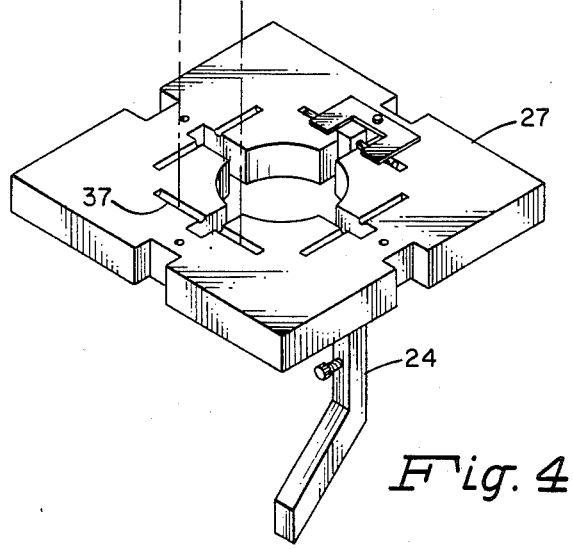

As best seen in FIG. 4 each finger is an elongated member with a pin 35 at the upper end, and a bend 36 at the lower end which functions as a jaw in cooperation with the opposing end of the other finger of the pair. Pivot pin 35 fits in a groove 37 provided in the lower plate 27 and held in place by flat spring 34. An offset member 38 is located on the stem of each finger between the pivot and jaw ends.

Figure 5:
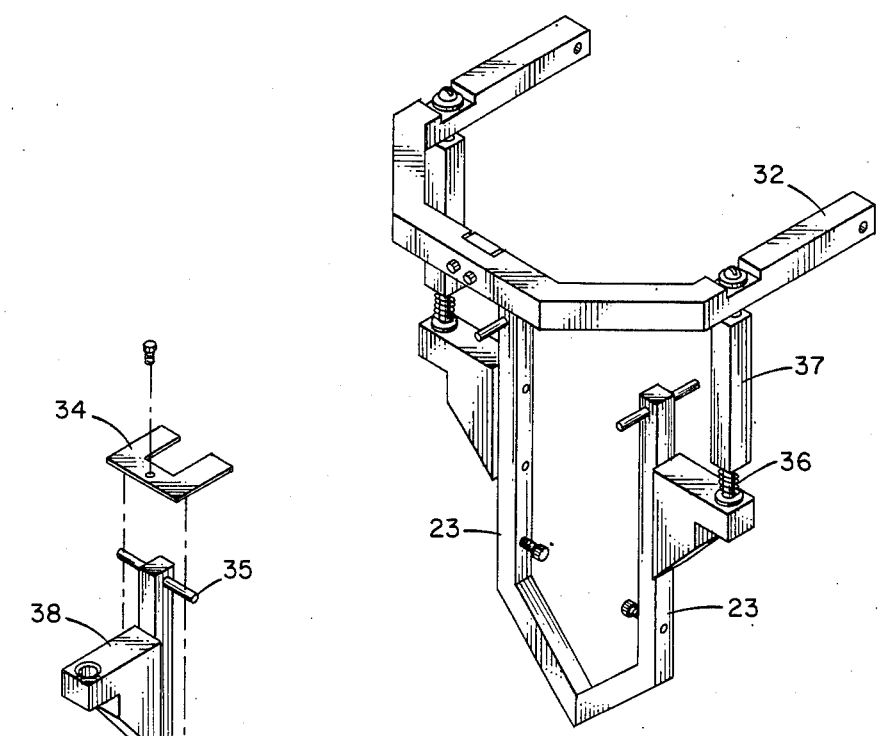
FIGS. 4 and 5 show in detail draws selected components of the finger assembly.

Referring now to FIG. 5, mechanical coupling is provided between a fork and each finger of a pair. Preferably the mechanical coupling includes a coil spring 36 at an end of a right coupling link 37, which bias the opposing fingers toward each other. Each finger may be provided with a set screw 38 to limit inward excursion of the jaws.

Movement of a cable wire causes the corresponding fork to pivot. As each fork arm is coupled to one pair of fingers, the fingers will open or close in response to actuation of the cables by the control handle. Each pair of fingers is actuated by a different cable so control of each pair is independent.

The finger assembly 13 may be mounted to a known mechanism (not shown) to impart vertical movement so that the fingers can move a workpiece with respect to a surface, for example a circuit board.

Having described the apparatus it will be appreciated that many variations may be made without departing from the scope of the invention, as described by the claims.

I claim:
1. Apparatus for holding workpieces, comprised of:
a hand operated control unit;
a finger assembly;
   a first cable including a first wire and a first jacket; and
   a second cable including a second wire and a second jacket, said cables for coupling motion between said control unit and said finger assembly, wherein
   (a) said control unit is comprised of:
      a housing having a first wall and a second wall orthogonal to said first wall;
      means to secure said first jacket to said first wall;
      means to secure said second jacket to said second wall;
      said first wall defining a hole;
      a shaft rotatably arranged in said hole having a first shaft segment extended from one end of said hole and a second shaft segment extending from the other end hole;
      a handle pivotly arranged on the first segment of said shaft, said handle including first clasping means for clasping said first wire parallel to the axis of said shaft; and
      second clasping means attached to said second segment of said shaft for clasping said second wire tangent to said shaft; whereupon pivoting said handle actuates said first wire and rotating said shaft by said handle actuates said second wire, (b) said finger assembly comprises:
   a cage having an upper plate, and a lower plate, and a plurality of bars extending between said plates;
   means for securing said first and second jackets to said upper plate;
   a first fork having two arms joined by a first connecting segment, the free ends of said arms pivotly arranged on two of said bars;
   means on said first connecting segment for clasping said first wire;
   a first pair of opposing fingers, each finger having an upper end pivotly arranged on said lower plate and a lower end facing the lower end of the opposing finger of the first pair and a bracket between said upper end and said lower end; and
   means for coupling each arm of said first fork to a bracket of a corresponding finger of said first pair of fingers;
   a second fork having two arms joined by a second connecting segment, the free arms of said arms pivotly arranged of two of said bars;
   means on said second connecting segment for clasping said second wire; and
   a second pair of opposing fingers, each finger having an upper end pivotly arranged on said lower plate and a lower end facing the lower end of the opposing finger of the first pair and a bracket between said upper end and said lower end; and
   means for coupling each arm of said second fork to a bracket of corresponding fingers of said second pair of fingers.

* * * * *